(12) United States Patent
Azuelos et al.

(10) Patent No.: US 11,221,864 B1
(45) Date of Patent: Jan. 11, 2022

(54) COMBINATORIAL AND SEQUENTIAL LOGIC COMPACTION IN ELECTRONIC CIRCUIT DESIGN EMULATION

(71) Applicant: Synopsys, Inc., Mountain View, CA (US)

(72) Inventors: Nathaniel Azuelos, Haifa (IL); Alexander Goltzman, Yokneam Ilit (IL); Boris Gommershtadt, Mevaseret Zion (IL)

(73) Assignee: Synopsys, Inc., Mountain View, CA (US)

( * ) Notice: Subject to any disclaimer, the term of this patent is extended or adjusted under 35 U.S.C. 154(b) by 33 days.

(21) Appl. No.: 16/887,487

(22) Filed: May 29, 2020

Related U.S. Application Data

(60) Provisional application No. 62/856,177, filed on Jun. 3, 2019.

(51) Int. Cl.
*G06F 9/455* (2018.01)
*G06F 30/323* (2020.01)

(52) U.S. Cl.
CPC ........ *G06F 9/45508* (2013.01); *G06F 30/323* (2020.01)

(58) Field of Classification Search
CPC .................................................. G06F 9/45508
USPC .......................................................... 703/23
See application file for complete search history.

(56) References Cited

U.S. PATENT DOCUMENTS

| | | | | |
|---|---|---|---|---|
| 9,372,947 | B1* | 6/2016 | Elmufdi | G06F 30/331 |
| 2003/0188269 | A1* | 10/2003 | Mitra | G01R 31/318566 716/135 |
| 2013/0305106 | A1* | 11/2013 | Mittal | G01R 31/318569 714/726 |
| 2017/0109466 | A1* | 4/2017 | Guerin | G06F 30/331 |
| 2020/0007617 | A1* | 1/2020 | Caissy | H04L 67/1023 |
| 2021/0199717 | A1* | 7/2021 | Liu | G01R 31/31703 |

* cited by examiner

*Primary Examiner* — Timothy A Mudrick
(74) *Attorney, Agent, or Firm* — Sterne, Kessler, Goldstein & Fox P.L.L.C.

(57) ABSTRACT

An emulation host system can configure a reprogrammable hardware emulation system to emulate an electronic circuit design. The emulation host system can analyze the electronic circuit design for electronic circuits that are repetitive. The emulation host system can partition the electronic circuits onto a single partition. The emulation host system can map the single partition onto a single programmable logic element (PLE) of the reprogrammable hardware emulation system. The emulation host system can configure the reprogrammable hardware emulation system to emulate the electronic circuits using the single PLE.

20 Claims, 11 Drawing Sheets

COMBINATORIAL AND SEQUENTIAL LOGIC COMPACTION IN ELECTRONIC CIRCUIT DESIGN EMULATION

CROSS-REFERENCE TO RELATED APPLICATIONS

The present application claims the benefit of U.S. Patent Appl. No. 62/856,177 filed on Jun. 3, 2019, which is incorporated herein by reference in its entirety.

TECHNICAL FIELD

The present disclosure relates to emulation of electronic circuit design and including emulating multiple electronic circuits within the electronic circuit design that are repetitive, namely, instantiated, using a single programmable logic element (PLE) within a reprogrammable hardware emulation system.

BACKGROUND

Hardware emulation represents the process of replicating the behavior of a hardware device using a reprogrammable hardware emulation system. These reprogrammable hardware emulation systems can include multiple programmable logic blocks with each programmable logic block including one or more programmable logic nodes, such as one or more field-programmable gate arrays (FPGAs) to provide an example, which are locally interconnected using one or more interconnect switches and/or one or more shared memories. During operation, the reprogrammable hardware emulation systems can accept a hardware logic description of the hardware device which is expressed using a hardware description language (HDL), such as register transfer language (RTL), Very High-Speed Integrated Circuit Hardware Description Language (VHDL), Verilog, or SystemVerilog to provide some examples. The reprogrammable hardware emulation system can thereafter utilize the hardware logic description of the hardware device to configure one or more of the multiple programmable logic blocks within the reprogrammable hardware emulation system to replicate the behavior of the hardware device. This allows the reprogrammable hardware emulation system to verify the functionality of the hardware device as well as to debug the hardware logic description of the hardware device when necessary.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Reprogrammable hardware emulation systems can include multiple programmable logic blocks with each programmable logic block including one or more programmable logic nodes, such as one or more field-programmable gate arrays (FPGAs) to provide an example, which are locally interconnected using one or more interconnect switches and/or one or more shared memories. The capacity of any reprogrammable hardware emulation system is limited by the number of programmable logic blocks with these reprogrammable hardware emulation systems. Those reprogrammable hardware emulation system with more programmable logic blocks can emulate larger electronic circuit designs as compared to those with fewer programmable logic blocks. The exemplary emulation design environment to be described herein analyzes the electronic circuit design for multiple electronic circuits within the electronic circuit design that are repetitive, namely, instantiated. Thereafter, the exemplary emulation design environment emulates these multiple instantiated electronic circuits using a single programmable logic element (PLE) within a reprogrammable hardware emulation system. This allows the exemplary emulation design environment to emulate larger electronic circuit designs using fewer programmable logic blocks.

Exemplary Emulation Design Environment

Figure 1:
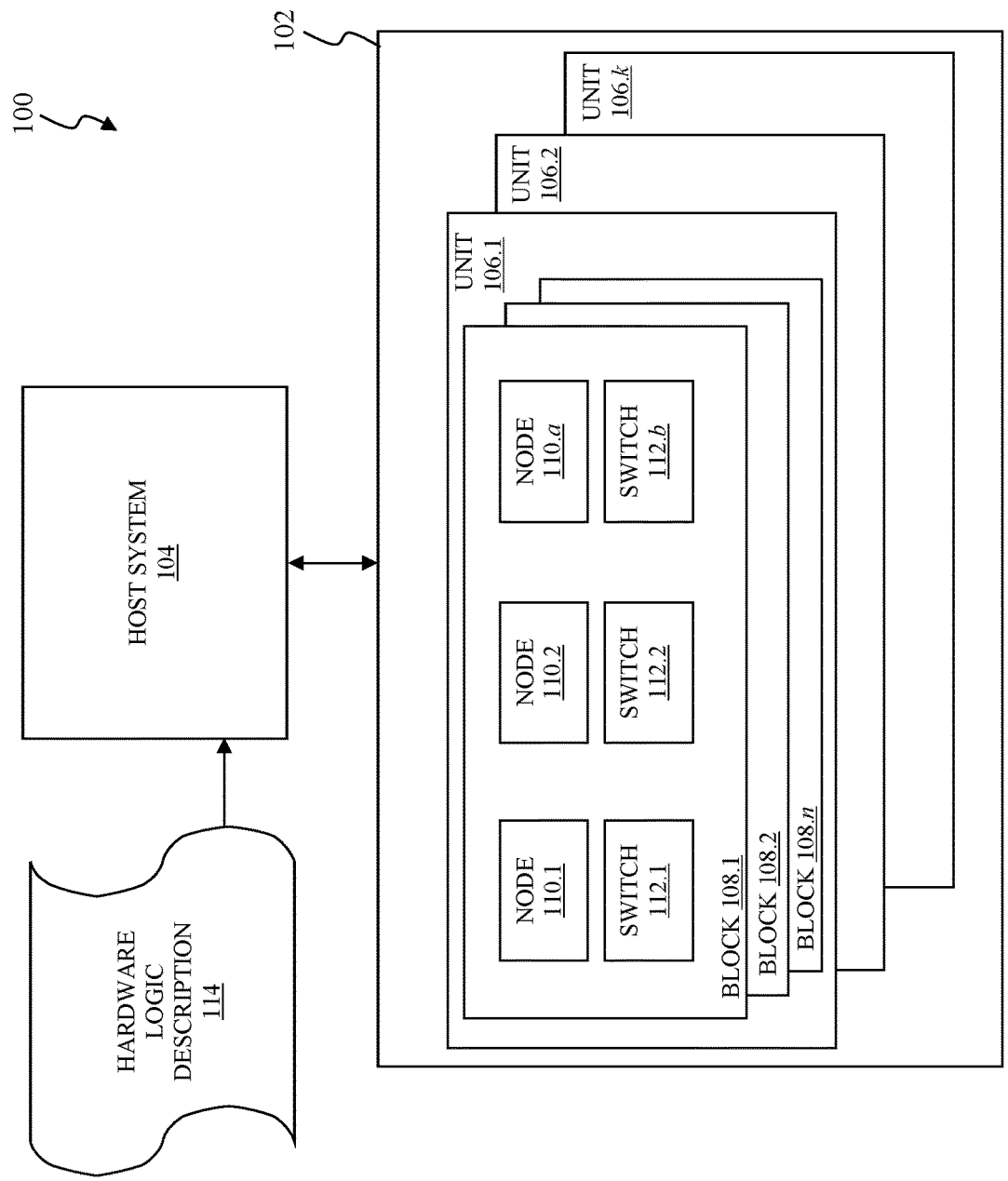
FIG. 1 graphically illustrates a simplified block diagram of an exemplary emulation design environment according to exemplary embodiments of the present disclosure.

FIG. 1 graphically illustrates a simplified block diagram of an exemplary emulation design environment according to exemplary embodiments of the present disclosure. In the exemplary embodiment illustrated in FIG. 1, an exemplary emulation environment 100 verifies the functionality of an electronic circuit design. As part of this verification, the exemplary emulation environment 100 analyzes the electronic circuit design for multiple electronic circuits within the electronic circuit design that are repetitive, namely, instantiated. As to be described in further detail below, the exemplary emulation environment 100 emulates a single instance of these instantiated electronic circuits and thereafter utilizes this single instance to verify the functionality of these instantiated electronic circuits. In the exemplary embodiment illustrated in FIG. 1, the exemplary emulation environment 100 includes a reprogrammable hardware emulation system 102 and an emulation host system 104.

The reprogrammable hardware emulation system 102 can be configured to replicate the behavior of the electronic circuit design to verify the functionality of the electronic circuit design. Generally, the reprogrammable hardware emulation system 102 represents a configuration and arrangement of programmable electronic devices which can be connected to each other in accordance with the electronic circuit design to emulate the electronic circuit design. In the exemplary embodiment illustrated in FIG. 1, the reprogrammable hardware emulation system 102 can include one or more programmable logic units 106.1 through 106.k. Each of the one or more programmable logic units 106.1 through 106.k can include one or more programmable logic blocks 108.1 through 108.n. Each of the one or more programmable logic blocks 108.1 through 108.n can include one or more programmable logic nodes 110.1 through 110.a which can be locally interconnected using one or more programmable interconnect switches 112.1 through 112.b and/or one or more shared memories. However, this implementation of the reprogrammable hardware emulation system 102 as illustrated in FIG. 1 is not limiting. Those skilled in the relevant art(s) will recognize that the reprogrammable hardware emulation system 102 need not include the one or more programmable logic units 106.1 through 106.k and/or the one or more programmable logic blocks 108.1 through 108.n without departing from the spirit and scope of the present disclosure.

Generally, the one or more programmable logic nodes 110.1 through 110.a and the one or more programmable interconnect switches 112.1 through 112.b represent one or more arrays of programmable logic blocks and interconnections that can be configured to emulate one or more combinational logic circuits and/or one or more sequential logic circuits as outlined in the electronic circuit design. For example, the one or more programmable logic nodes 110.1 through 110.a and the one or more programmable interconnect switches 112.1 through 112.b can be configured to emulate the one or more combinational logic circuits using one or more logical gates such as logical AND gates, one or more logical OR gates, one or more logical INVERTER gates, one or more logical NAND gates, one or more logical NOR gates, one or more logical XOR gates, or any combination thereof to provide some examples. As another example, the one or more programmable logic nodes 110.1 through 110.a can include one or more memories, such as one or more latches, one or more flip-flops, and/or one or more other blocks of memory to provide some examples which can temporarily store signals within the reprogrammable hardware emulation system 102 which can be utilized to emulate the one or more sequential logic circuits. In some embodiments, the one or more programmable logic nodes 110.1 through 110.a can be implemented using one or more Programmable Logic Arrays (PLAs), one or more Programmable Array Logic (PAL) devices, one or more Generic Logic Arrays (GLAs), one or more Field Programmable Gate Array (FPGAs), and/or one or more specialized application-specific integrated circuits (ASICs) for emulation or prototyping to provide some examples. In some embodiments, the one or more programmable logic nodes 110.1 through 110.a can additionally include one or more programmable interfaces which can be used to interface with the one or more programmable logic nodes 110.1 through 110.a themselves and/or with other programmable logic nodes 110.1 through 110.a using the one or more programmable interconnect switches 112.1 through 112.b.

The emulation host system 104 can configure the reprogrammable hardware emulation system 102, for example, the one or more programmable logic units 106.1 through 106.k, the one or more programmable logic blocks 108.1 through 108.n, the one or more programmable logic nodes 110.1 through 110.a, and/or the one or more programmable interconnect switches 112.1 through 112.b, to emulate the electronic circuit design. As illustrated in FIG. 1, the emulation host system 104 can accept a hardware logic description 114 of the electronic circuit design. In some embodiments, the hardware logic description 114 can be expressed using a hardware description language (HDL), such as register transfer language (RTL), Very High-Speed Integrated Circuit Hardware Description Language (VHDL), Verilog, or SystemVerilog to provide some examples. Alternatively, or in addition to, the hardware logic description 114 can be in netlist level files or a mix of netlist level files and HDL files.

In the exemplary embodiment illustrated in FIG. 1, the emulation host system 104 can utilize the hardware logic description 114 to configure the reprogrammable hardware emulation system 102 to emulate the electronic circuit design. In some embodiments, the emulation host system 104 can utilize the hardware logic description 114 to partition the electronic circuit design into one or more partitions and thereafter map the one or more partitions of the electronic circuit design onto the one or more programmable logic units 106.1 through 106.k, the one or more programmable logic blocks 108.1 through 108.n, the one or more programmable logic nodes 110.1 through 110.a, and/or the one or more programmable interconnect switches 112.1 through 112.b. In some embodiments, the emulation host system 104 can synthesize the hardware logic description 114 to create a gate level netlist of the electronic circuit design using the hardware logic description 114. In these embodiments, the emulation host system 104 can partition the electronic circuit design into the one or more partitions at the gate level using the gate level netlist of the electronic circuit design. In some embodiments, the emulation host system 104 can optionally synthesize the one or more partitions to include sampling instrumentation, such as trace logic to trace one or more states of one or more electronic components of the electronic circuit design and/or trace and injection logic to trace and/or to inject one or more electronic signals within the reprogrammable hardware emulation system 102 to provide some examples.

In some embodiments, for example, as part of this partitioning, the emulation host system 104 can analyze the hardware logic description 114 for electronic circuitry within the electronic circuit design that is repetitive, namely, instantiated, and/or whose implementations can be mapped onto a single programmable logic element (PLE) within the reprogrammable hardware emulation system 102. In the exemplary embodiment illustrated in FIG. 1, the PLE can represent a single programmable logic unit from among the one or more programmable logic units 106.1 through 106.k, a single programmable logic block from among the one or more programmable logic blocks 108.1 through 108.n, and/or a single programmable logic node from among the one or more programmable logic nodes 110.1 through 110.a to provide some examples. In these embodiments, the emulation host system 104 can partition each of these instantiated circuitries into a single partition from among the one or more partitions and thereafter map the single partition onto the single PLE. As to be described in further detail below, the reprogrammable hardware emulation system 102 can emulate all of these instantiated circuitries using the single PLE to verify the functionality of these instantiated circuitries. In some embodiments, the single PLE can include one or more programmable interfaces, such as one or more input multiplexers and/or one or more output demultiplexers to provide some examples, which can be used to connect the single PLE to other programmable logic devices (PLEs) of the reprogrammable hardware emulation system 102, such as other programmable logic units from among the one or more programmable logic units 106.1 through 106.$k$, other programmable logic blocks from among the one or more programmable logic blocks 108.1 through 108.$n$, and/or other programmable logic nodes from among the one or more programmable logic nodes 110.1 through 110.$a$ to verify the functionality of the electronic circuit design. In these embodiments, the emulation host system 104 can synthesize the one or more programmable interfaces into the single partition.

After partitioning the electronic circuit design into the one or more partitions, the emulation host system 104 can thereafter map the one or more partitions of the electronic circuit design onto the one or more programmable logic units 106.1 through 106.$k$, the one or more programmable logic blocks 108.1 through 108.$n$, the one or more programmable logic nodes 110.1 through 110.$a$, and/or the one or more programmable interconnect switches 112.1 through 112.$b$ to emulate the electronic circuit design. In some embodiments, the emulation host system 104 can utilize one or more design rules, one or more design constraints, for example, timing or logic constraints, and/or information about the reprogrammable hardware emulation system 102 to map the one or more partitions. In some embodiments, the emulation host system 104 can store information describing which programmable logic units from among the one or more programmable logic units 106.1 through 106.$k$, which programmable logic blocks from among the one or more programmable logic blocks 108.1 through 108.$n$, which programmable logic nodes from among the one or more programmable logic nodes 110.1 through 110.$a$, and/or which programmable interconnect switches from among the one or more programmable interconnect switches 112.1 through 112.$b$ are to be used to emulate the electronic circuit design.

After mapping the one or more partitions of the electronic circuit design, the emulation host system 104 can configure the reprogrammable hardware emulation system 102 in accordance with this mapping to replicate the behavior of the electronic circuit design. In some embodiments, the emulation host system 104 can generate one or more configuration files that describe the one or more partitions and the mapping of these partitions onto the one or more programmable logic units 106.1 through 106.$k$, the one or more programmable logic blocks 108.1 through 108.$n$, the one or more programmable logic nodes 110.1 through 110.$a$, and/or the one or more programmable interconnect switches 112.1 through 112.$b$. In these embodiments, the one or more configuration files can include additional information such as constraints of the electronic circuit design and routing information of connections between the one or more programmable logic units 106.1 through 106.$k$, the one or more programmable logic blocks 108.1 through 108.$n$, the one or more programmable logic nodes 110.1 through 110.$a$, and/or the one or more programmable interconnect switches 112.1 through 112.$b$ and connections of the one or more programmable logic units 106.1 through 106.$k$, the one or more programmable logic blocks 108.1 through 108.$n$, the one or more programmable logic nodes 110.1 through 110.$a$, and/or the one or more programmable interconnect switches 112.1 through 112.$b$. In these embodiments, the emulation host system 104 can generate a configuration file from among the one or more configuration files for each partition from among the one or more partitions.

After generating one or more configuration files, the emulation host system 104 can provide the one or more configuration files to the reprogrammable hardware emulation system 102. In some embodiments, the emulation host system 104 can be communicatively coupled to the reprogrammable hardware emulation system 102 by one or more emulation connections, such as one or more electrical cables, for example cables with pin structures compatible with the Recommended Standard 232 (RS232) or universal serial bus (USB) protocols. The one or more emulation connections can be a wired communication medium or network such as a local area network or a wide area network such as the Internet. The one or more emulation connections can be a wireless communication medium or a network with one or more points of access using a wireless protocol such as BLUETOOTH or IEEE 802.11. Alternatively, or in addition to, the emulation host system 104 can be communicatively coupled to the reprogrammable hardware emulation system 102 through an intermediary electronic device such as a network server to provide an example.

The reprogrammable hardware emulation system 102 can configure the one or more programmable logic units 106.1 through 106.$k$, the one or more programmable logic blocks 108.1 through 108.$n$, the one or more programmable logic nodes 110.1 through 110.$a$, and/or the one or more programmable interconnect switches 112.1 through 112.$b$ in accordance with the one or more configuration files to emulate the electronic circuit design. In some embodiments, the emulation host system 104 can control the emulation of the electronic circuit design by the reprogrammable hardware emulation system 102. For example, the emulation host system 104 can cause the reprogrammable hardware emulation system 102 to start or stop executing the emulation of the electronic circuit design. Additionally, the emulation host system 104 can provide input signals and/or data to the reprogrammable hardware emulation system 102 to be used to emulate the electronic circuit design. The emulation host system 104 can provide these input signals and/or data to the reprogrammable hardware emulation system 102 through the one or more emulation connections and/or through other electronic devices, such as a remote test board, a signal generator, another reprogrammable hardware emulation system, and/or another host system to provide some examples. In some embodiments, for example, during emulation of the electronic circuit design or at the end of the emulation of the electronic circuit design, the emulation host system 104 can receive one or more emulation results from the reprogrammable hardware emulation system 102 through the one or more emulation connections. The one or more emulation results can include data and/or information generated by the reprogrammable hardware emulation system 102 during the emulation of the electronic circuit design. This data and/or information can include data and/or information describing one or more states of one or more electronic components of the electronic circuit design and/or data and information describing one or more electronic signals within the reprogrammable hardware emulation system 102.

After emulation of the electronic circuit design, the emulation host system 104 can be used to debug one or more the one or more electronic components of the electronic circuit. In some embodiments, emulation host system 104 identifies which programmable logic units from among the one or more programmable logic units 106.1 through 106.$k$, which programmable logic blocks from among the one or more programmable logic blocks 108.1 through 108.$n$, which one or more programmable logic nodes from among the one or more programmable logic nodes 110.1 through 110.a, and/or which programmable interconnect switches from among the one or more programmable interconnect switches 112.1 through 112.b are being used by the reprogrammable hardware emulation system 102 to emulate one or more electronic components of the electronic circuit. In these embodiments, the emulation host system 104 retrieves one or more electronic signals within the reprogrammable hardware emulation system 102 which are traced by the identified programmable logic units, the identified programmable logic blocks, the identified programmable logic nodes, and/or the identified programmable interconnect switches. Thereafter, the emulation host system 104 transmits the retrieved electronic signals to the reprogrammable hardware emulation system 102 to re-emulate the one or more electronic components for a specified time period. The reprogrammable hardware emulation system 102 injects the one or more electronic signals into the identified programmable logic units, the identified programmable logic blocks, the identified programmable logic nodes, and/or the identified programmable interconnect switches to re-emulate the one or more electronic components.

Exemplary Instantiated Electronic Circuitry within an Exemplary Electronic Circuit Design As described above, the electronic circuit design can be analyzed for electronic circuitry that is repetitive, namely, instantiated, and/or whose implementations can be mapped onto a single PLE within a reprogrammable hardware emulation system, such as the reprogrammable hardware emulation system 102, to provide some examples. Each of these instantiated circuitries can be partitioned into a single partition which is thereafter mapped onto the single PLE. The discussion of FIG. 2 through FIG. 6 to follow is to describe various exemplary instantiated electronic circuitry within the electronic circuit design.

Figure 2:
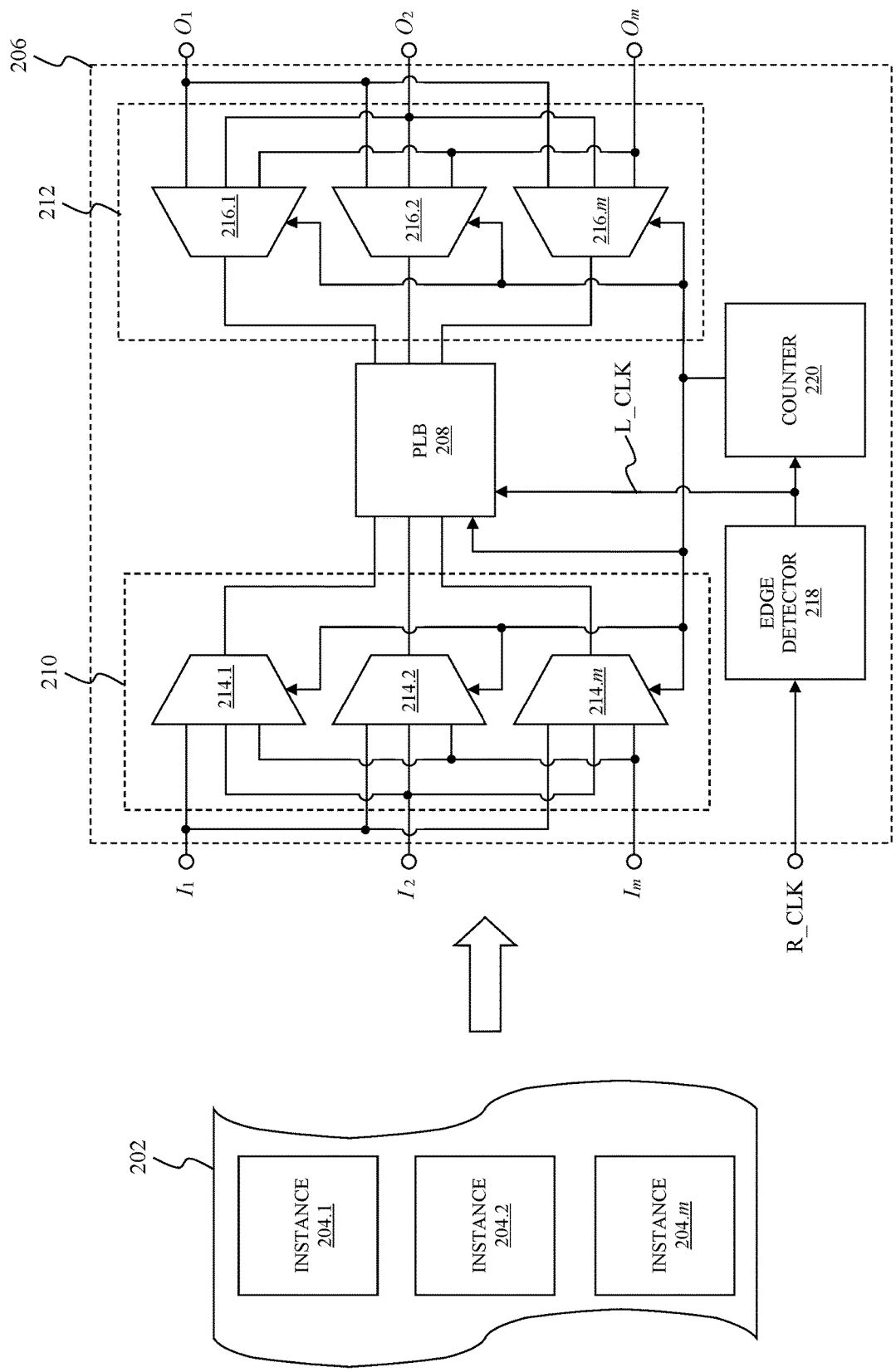
FIG. 2 graphically illustrates an exemplary instantiated electronic circuitry according to exemplary embodiments of the present disclosure.

FIG. 2 graphically illustrates an exemplary instantiated electronic circuitry according to exemplary embodiments of the present disclosure. In the exemplary embodiment illustrated in FIG. 2, an emulation host system, such as the emulation host system 104 as described above in FIG. 1, can analyze a hardware logic description 202 of an electronic circuit design to identify circuit instances 204.1 through 204.m of electronic circuitry within the electronic circuit design that are repetitive, namely, instantiated, and/or whose implementations can be mapped onto a single programmable logic element (PLE) 206. The PLE 206 can represent an exemplary embodiment of a single programmable logic unit from among the one or more programmable logic units 106.1 through 106.k, a single programmable logic block from among the one or more programmable logic blocks 108.1 through 108.n, and/or a single programmable logic node from among the one or more programmable logic nodes 110.1 through 110.a as described above in FIG. 1. The hardware logic description 202, as illustrated in FIG. 2, can represent an exemplary embodiment of the hardware logic description 114 as described above in FIG. 1. The emulation host system can thereafter partition the circuit instances 204.1 through 204.m of the electronic circuitry into one or more partitions and thereafter map these partitions onto a programmable logic block (PLB) 208 within the PLE 206. The PLB 208 can include one or more programmable logic blocks (PLBs) of one or more Programmable Logic Arrays (PLAs), one or more Programmable Array Logic (PAL) devices, one or more Generic Logic Arrays (GLAs), one or more Field Programmable Gate Array (FPGAs), and/or one or more specialized application-specific integrated circuits (ASICs) for emulation or prototyping, and/or any combination thereof to provide some examples.

In some embodiments, the PLE 206 can include a programmable input interface 210 and a programmable output interface 212 to connect the PLE 206 to other programmable logic elements of the electronic circuit design to verify the functionality of the electronic circuit design. In some embodiments, the circuit instances 204.1 through 204.m of electronic circuitry can be sequentially emulated by configuring the programmable input interface 210 to sequentially provide input emulation data sets $I_1$ through $I_m$ to the PLB 208 and/or configuring the programmable output interface 212 to sequentially provide output emulation data sets $O_1$ through $O_m$ from the PLB 208. In the exemplary embodiment illustrated in FIG. 2, the programmable input interface 210 and the programmable output interface 212 can include input multiplexers 214.1 through 214.m, one or more output demultiplexers 216.1 through 216.m. In the exemplary embodiment illustrated in FIG. 2, each of the circuit instances 204.1 through 204.m of the electronic circuitry is associated with one or more corresponding input emulation data sets from among the input emulation data sets $I_1$ through $I_m$. As illustrated in FIG. 2, the one or more input multiplexers 214.1 through 214.m selectively choose one or more input emulation data sets from among the input emulation data sets $I_1$ through $I_m$ that corresponds to one or more circuit instances from among the circuit instances 204.1 through 204.m and thereafter apply the one or more input emulation data sets to the PLB 208 to emulate the one or more circuit instances. As an example, the one or more input multiplexers 214.1 through 214.m can selectively choose the input emulation data set $I_1$ corresponding to the circuit instance 204.1 and thereafter apply the input emulation data set $I_1$ to the PLB 208 to emulate the circuit instance 204.1 of the electronic circuitry.

Moreover, each of the circuit instances 204.1 through 204.m of the electronic circuitry is also associated with one or more corresponding output emulation data sets from among the output emulation data sets $O_1$ through $O_m$. As illustrated in FIG. 2, the one or more output demultiplexers 216.1 through 216.m receive one or more output emulation data sets from the PLB 208 that corresponds to one or more circuit instances from among the circuit instances 204.1 through 204.m and thereafter provide the one or more output emulation data sets to one or more output emulation data sets from among the output emulation data sets $O_1$ through $O_m$ that corresponds to the one or more circuit instances. As an example, the one or more output demultiplexers 216.1 through 216.m can receive an output emulation data set from the PLB 208 that corresponds to the circuit instance 204.1 and thereafter can provide the output emulation data set to the output emulation data set $O_1$ through $O_m$ that corresponds to the circuit instance 204.1.

In some embodiments, the PLE 206 can include an edge detector 218 and/or a counter 220. In the exemplary embodiment illustrated in FIG. 2, the edge detector 218 can synchronize the emulation of the circuit instances 204.1 through 204.m of electronic circuitry by the PLB 208 to one or more edges, for example, one or more rising edges and/or one or more falling edges, of a remote clocking signal R_CLK to provide a local clocking signal L_CLK. And, as described above, the circuit instances 204.1 through 204.m of electronic circuitry can be sequentially emulated by configuring the programmable input interface 210 to sequentially provide the input emulation data sets $I_1$ through $I_m$ and/or configuring the programmable output interface 212 to sequentially provide the output emulation data sets $O_1$ through $O_m$. In the exemplary embodiment illustrated in FIG. 2, the counter 220 can generate one or more output lines based upon the local clocking signal L_CLK. In some embodiments, the one or more output lines can represent a number, such as a binary number or a binary-coded decimal (BCD) to provide some examples, which can be utilized by the programmable input interface 210 to sequentially provide the input emulation data sets $I_1$ through $I_m$ and/or by the programmable output interface 212 to sequentially provide the output emulation data sets $O_1$ through $O_m$. In some embodiments, the one or more output lines can represent one or more addresses used by the PLB 208 to identify one or more of the circuit instances 204.1 through 204.m of the electronic circuitry being emulated by the PLB 208.

Exemplary Combinational Logic Circuit Instances

Figure 3:
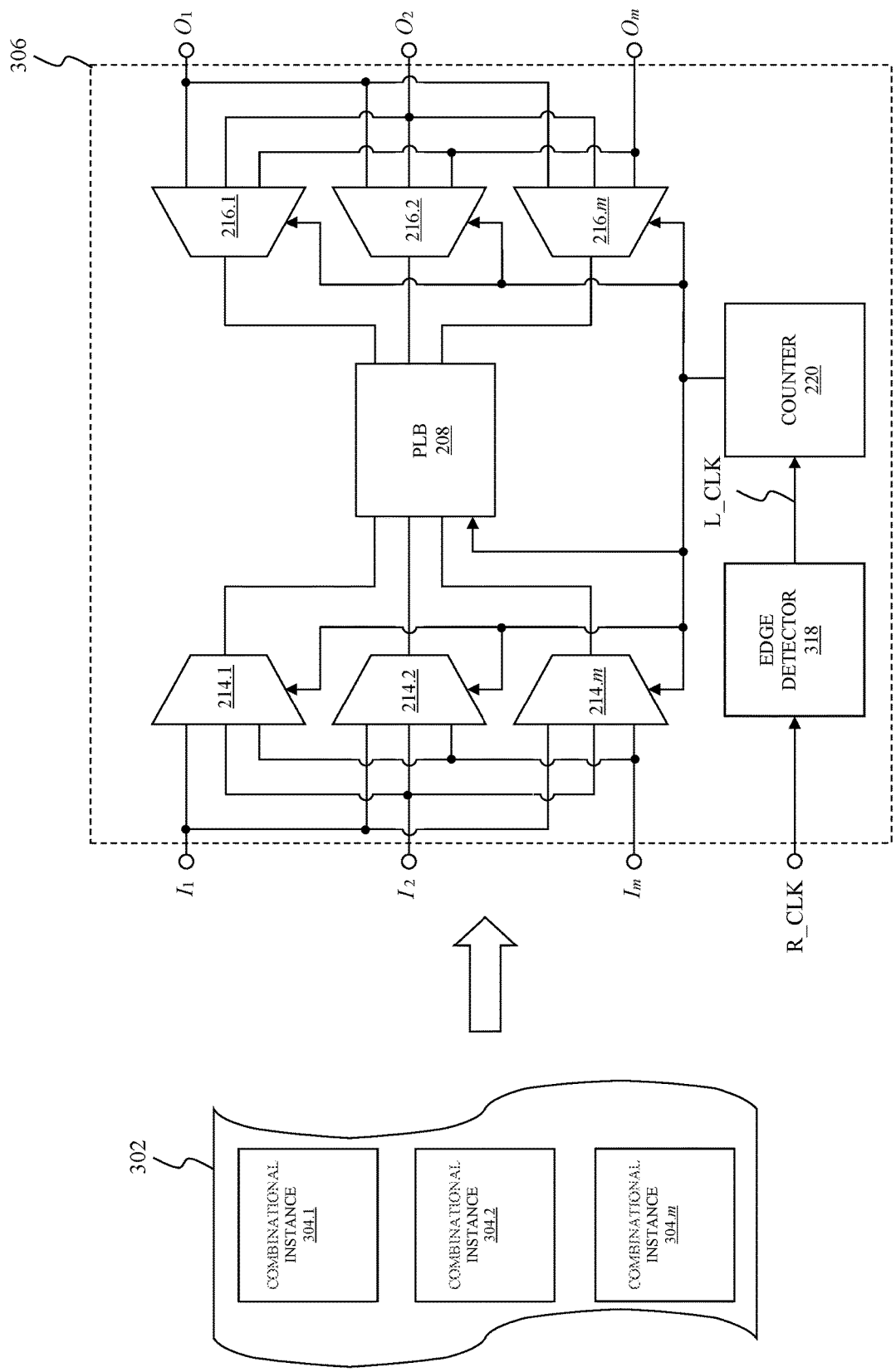
FIG. 3 graphically illustrates an exemplary partition of combinational logic instantiated electronic circuitry according to exemplary embodiments of the present disclosure.

FIG. 3 graphically illustrates an exemplary partition of combinational logic instantiated electronic circuitry according to exemplary embodiments of the present disclosure. In the exemplary embodiment illustrated in FIG. 3, an emulation host system, such as the emulation host system 104 as described above in FIG. 1, can analyze a hardware logic description 302 of an electronic circuit design to identify combinational logic circuit instances 304.1 through 304.m of electronic circuitry within the electronic circuit design that are repetitive, namely, instantiated, and/or whose implementations can be mapped onto the PLB 208. Generally, the combinational logic circuit instances 304.1 through 304.m of electronic circuitry represent one or more instantiated electronic circuits whose outputs are functions of their present values of their inputs. The combinational logic circuit instances 304.1 through 304.m can be implemented using one or more logical gates such as logical AND gates, one or more logical OR gates, one or more logical INVERTER gates, one or more logical NAND gates, one or more logical NOR gates, one or more logical XOR gates, or any combination thereof to provide some examples. The hardware logic description 302, as illustrated in FIG. 2, can represent an exemplary embodiment of the hardware logic description 114 as described above in FIG. 1. The emulation host system can thereafter partition the combinational logic circuit instances 304.1 through 304.m of electronic circuitry into one or more partitions and thereafter map these partitions onto the PLB 208 within a single programmable logic element (PLE) 306. The PLE 306 as illustrated in FIG. 3 is substantially similar to the PLE 206 as illustrated in FIG. 2; therefore, only differences between the PLE 206 and the PLE 306 are to be described in further detail below.

In some embodiments, the PLE 306 can include an edge detector 318 to provide a local clocking signal L_CLK based upon one or more edges, for example, one or more rising edges and/or one or more falling edges, of a remote clocking signal R_CLK. And, in a similar manner as described above, the combinational logic circuit instances 304.1 through 304.m of electronic circuitry can be sequentially emulated by configuring the input multiplexers 214.1 through 214.m to sequentially choose from among the input emulation data sets $I_1$ through $I_m$ and/or configuring the output demultiplexers 216.1 through 216.m to sequentially choose from among the output emulation data sets $O_1$ through $O_m$. In the exemplary embodiment illustrated in FIG. 3, the counter 220 can generate one or more output lines based upon the local clocking signal L_CLK. In some embodiments, the one or more output lines can represent a number, such as a binary number or a binary-coded decimal (BCD) to provide some examples, which can be utilized by the input multiplexers 214.1 through 214.m to sequentially provide the input emulation data sets $I_1$ through $I_m$ and/or by the one or more output demultiplexers 216.1 through 216.m to sequentially provide the output emulation data sets $O_1$ through $O_m$.

Exemplary Sequential Logic Circuit Instances

FIG. 4A through FIG. 4E graphically illustrate an exemplary partition of sequential logic instantiated electronic circuitry according to exemplary embodiments of the present disclosure. In the exemplary embodiment illustrated in FIG. 4, an emulation host system, such as the emulation host system 104 as described above in FIG. 1, can analyze a hardware logic description 402 of an electronic circuit design to identify sequential logic circuit instances 404.1 through 404.m of electronic circuitry within the electronic circuit design that are repetitive, namely, instantiated, and/or whose implementations can be mapped onto the PLB 406. Generally, the sequential logic circuit instances 404.1 through 404.m of the electronic circuitry represent one or more instantiated electronic circuits whose outputs are functions of their past values of their inputs and/or outputs. The sequential logic circuit instances 404.1 through 404.m can be implemented using one or more logical gates such as logical AND gates, one or more logical OR gates, one or more logical INVERTER gates, one or more logical NAND gates, one or more logical NOR gates, one or more logical XOR gates, or any combination thereof to provide some examples with one or more feedback memory elements, such as one or more flip-flops, one or more shift registers, and/or one or more latches to provide some examples, coupled between one or more inputs and/or one or more outputs of the one or more logical gates. The hardware logic description 402, as illustrated in FIG. 2, can represent an exemplary embodiment of the hardware logic description 114 as described above in FIG. 1. The emulation host system can thereafter partition the sequential logic circuit instances 404.1 through 404.m of electronic circuitry into one or more partitions and thereafter map these partitions onto a programmable logic block (PLB) 408 within the PLB 406. The PLE 406 as illustrated in FIG. 4 is substantially similar to the PLE 206 as illustrated in FIG. 2; therefore, only differences between the PLE 206 and the PLE 406 are to be described in further detail below.

In some embodiments, the sequential logic circuit instances 404.1 through 404.m of the electronic circuitry can include one or more flip-flops, such as one or more set-reset (SR) flip-flops, one or more data (D)) flip-flops, one or more JK flip-flops, and/or one or more toggle (T) flip-flops to provide some examples, and/or one or more latches, such one or more SR latches, one or more D latches, one or more JK latches, and/or one or more T latches to provide some examples. In these embodiments, the emulation host system can synthesize the PLE 406 to effectively replace these flip-flops and/or these latches with functionally equivalent electronic circuitry as illustrated in FIG. 4B through FIG. 4E.

Figure 4A:
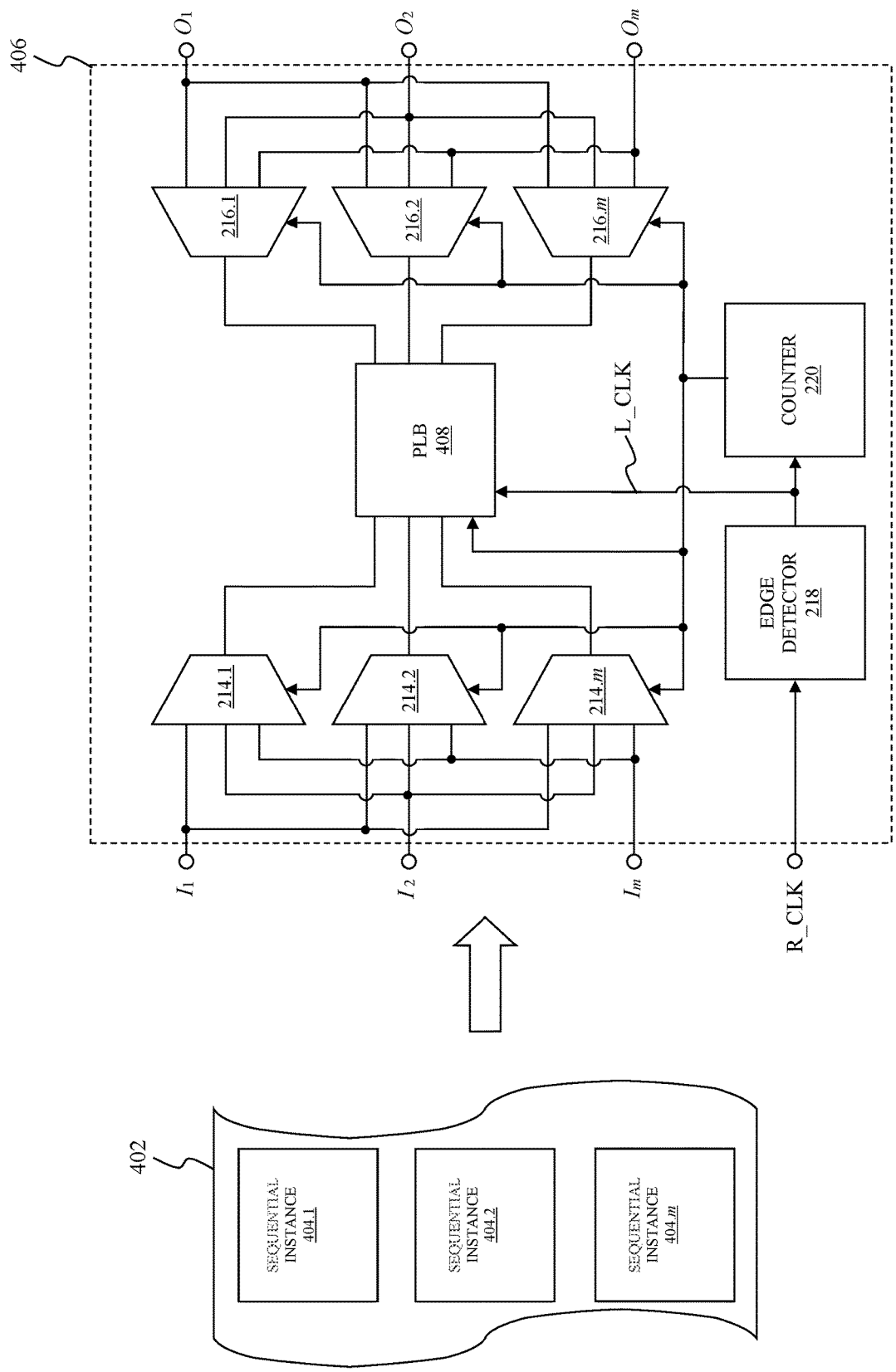
FIG. 4A through FIG. 4E graphically illustrate an exemplary partition of sequential logic instantiated electronic circuitry according to exemplary embodiments of the present disclosure.
Figure 4C:
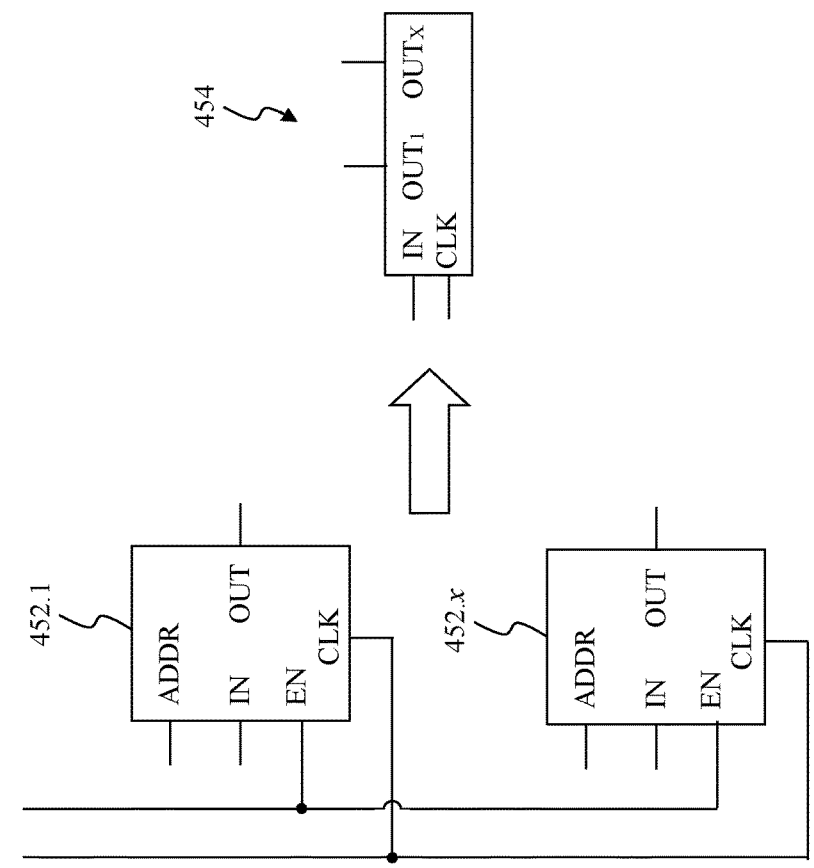
Figure 4B:
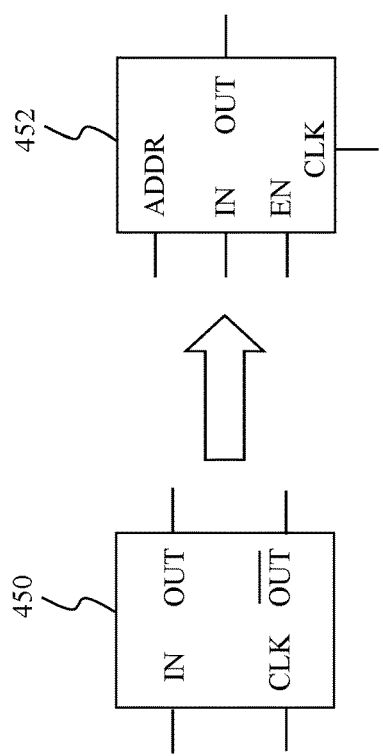

As illustrated in FIG. 4B, the emulation host system can synthesize the PLE 406 to effectively replace a flip-flop 450, such as a SR flip-flop, a D flip-flop, a JK flip-flop, or a T flip-flop to provide some examples, within the sequential logic circuit instances 404.1 through 404.m with a functionally equivalent memory element 452. As part of this replacement, the emulation host system effectively connects the input IN of the memory element 452 to the same electronic circuitry as the input IN of the flip-flop 450 and effectively connects the output OUT of the memory element 452 to the same electronic circuitry as the output OUT of the flip-flop 450. Moreover, the emulation host system effectively connects the address ADDR of the memory element 452 to the one or more output lines of the counter 220. In some embodiments, each sequential logic circuit instance from among the sequential logic circuit instances 404.1 through 404.m corresponds to a different combination of values, namely, a count, on the one or more output lines. In these embodiments, data and/or information stored in the memory element 452 for any sequential logic circuit instance from among the sequential logic circuit instances 404.1 through 404.m can be accessed by interfacing the address ADDR of the memory element 452 with a corresponding count via the one or more output lines. In some embodiments, one or more of the input multiplexers 214.1 through 214.m as illustrated in FIG. 4A, can be configured to select a memory element clocking signal from among one or more memory element clocking signals and provide the selected clocking signal to the enable EN of the memory element 452. In these embodiments, different clocking signals from among the one or more memory element clocking signals can be provided to different memory elements within the PLE 406 to sequentially emulate the sequential logic circuit instances 404.1 through 404.m. In these embodiments, the one or more memory element clocking signals can be synchronized to one or more edges, for example, one or more rising edges and/or one or more falling edges, of the remote clocking signal R_CLK. In some embodiments, the remote clocking signal R_CLK can be provided as the clocking signal CLK of the memory element 452.

In some embodiments, as illustrated in FIG. 4C, the emulation host system can synthesize the PLE 406 to effectively replace multiple flip-flops with multiple functionally equivalent memory elements 452.1 through 452.x. In these embodiments, as illustrated in FIG. 4C, the emulation host system can synthesize the PLE 406 to effectively replace the multiple functionally equivalent memory elements 452.1 through 452.x within the sequential logic circuit instances 404.1 through 404.m with a functionally equivalent shift register 454. As illustrated in FIG. 4C, the emulation host system can effectively replace the multiple functionally equivalent memory elements 452.1 through 452.x with the functionally equivalent shift register 454 when the memory elements 452.1 through 452.x share a common clocking signal CLK and enable EN. In the exemplary embodiment illustrated in FIG. 4C, the emulation host system effectively connects the input IN of the memory element 452 to the same electronic circuitry as the input IN of the memory element 452.1 and effectively connects the outputs $OUT_1$ through $OUT_X$ of the shift register 454 to the same electronic circuitry as the corresponding output OUT of the memory elements 452.1 through 452.x.

Figures 4D, 4E:
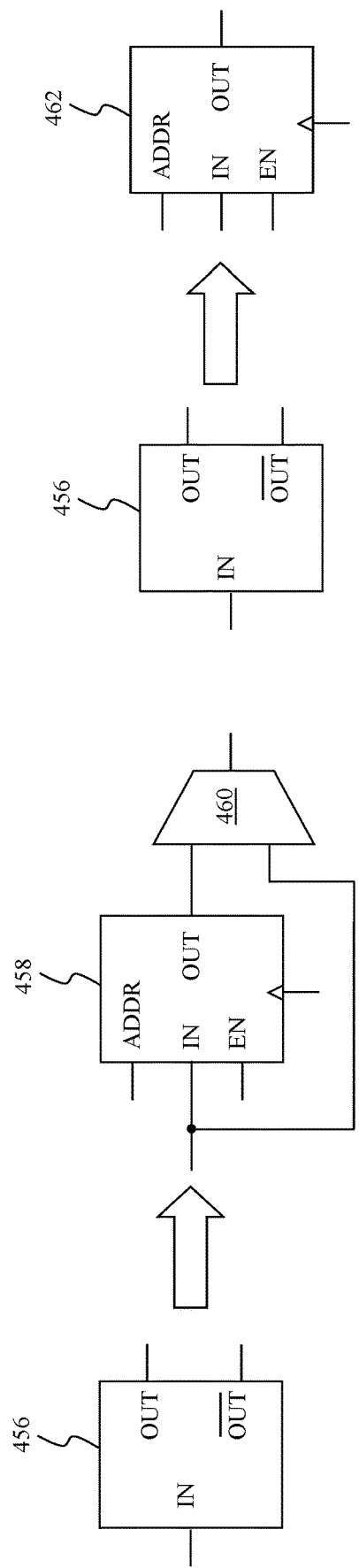

As illustrated in FIG. 4D, the emulation host system can synthesize the PLE 406 to effectively replace a latch 456, such as a SR latch, a D latch, a JK latch, or a T latch to provide some examples, within the sequential logic circuit instances 404.1 through 404.m with a functionally equivalent memory element 458 and multiplexer 460. As part of this replacement, the emulation host system effectively connects the input IN of the memory element 458 to the same electronic circuitry as the input IN of the latch 456 and effectively connects an output of the multiplexer 460 to the same electronic circuitry as the output OUT of the latch 456. Additionally, the emulation host system effectively connects the input IN of the memory element 458 to a first input of the multiplexer 460 and the output OUT of the memory element 458 to a second input of the multiplexer 460. In situations where the latch 456 is operate in a pass-through mode of operation, namely, the input IN of the latch 456 is to be passed onto the output OUT of the latch 456, the multiplexer 460 selectively chooses the input IN of the memory element 458 to be the output of the multiplexer 460. Otherwise, the multiplexer 460 selectively chooses the output OUT of the memory element 458 to be the output of the multiplexer 460. Moreover, the emulation host system effectively connects the address ADDR of the memory element 458 to the one or more output lines of the counter 220. In some embodiments, each sequential logic circuit instance from among the sequential logic circuit instances 404.1 through 404.m corresponds to a different combination of values, namely, a count, on the one or more output lines. In these embodiments, data and/or information stored in the memory element 458 for any sequential logic circuit instance from among the sequential logic circuit instances 404.1 through 404.m can be accessed by interfacing the address ADDR of the memory element 458 with a corresponding count via the one or more output lines. In some embodiments, one or more of the input multiplexers 214.1 through 214.m as illustrated in FIG. 4A, can selectively choose a memory element clocking signal from among one or more memory element clocking signals and provide the selected clocking signal to the enable EN of the memory element 458. In these embodiments, different clocking signals from among the one or more memory element clocking signals can be provided to different memory elements within the PLE 406 to sequentially emulate the sequential logic circuit instances 404.1 through 404.m. In these embodiments, the one or more memory element clocking signals can be synchronized to one or more edges, for example, one or more rising edges and/or one or more falling edges, of the remote clocking signal R_CLK. In some embodiments, the remote clocking signal R_CLK can be provided as the clocking signal CLK of the memory element 458.

Alternatively, or in addition to, the emulation host system can synthesize the PLE 406 to effectively replace the latch 456 within the sequential logic circuit instances 404.1 through 404.m with a functionally equivalent memory element 462 as illustrated FIG. 4E. As part of this replacement, the emulation host system effectively connects the input IN of the memory element 462 to the same electronic circuitry as the input IN of the latch 456 and effectively connects the output OUT of the memory element 462 to the same electronic circuitry as the output OUT of the latch 456. Moreover, the emulation host system effectively connects the address ADDR of the memory element 462 to the one or more output lines of the counter 220. In some embodiments, each sequential logic circuit instance from among the sequential logic circuit instances 404.1 through 404.m corresponds to a different combination of values, namely, a count, on the one or more output lines. In these embodiments, data and/or information stored in the memory element 462 for any sequential logic circuit instance from among the sequential logic circuit instances 404.1 through 404.m can be accessed by interfacing the address ADDR of the memory element 462 with a corresponding count via the one or more output lines. In some embodiments, one or more of the input multiplexers 214.1 through 214.m as illustrated in FIG. 4A, can selectively choose a memory element clocking signal from among one or more memory element clocking signals and provide the selected clocking signal to the enable EN of the memory element 462. In these embodiments, different clocking signals from among the one or more memory element clocking signals can be provided to different memory elements within the PLE 406 to sequentially emulate the sequential logic circuit instances 404.1 through 404.m. In these embodiments, the one or more memory element clocking signals can be synchronized to one or more logical states, for example, one or more logical ones and/or one or more logical zeros, of the remote clocking signal R_CLK utilizing, for example, the edge detector 218. In some embodiments, the remote clocking signal R_CLK can be provided as the clocking signal CLK of the memory element 462.

Exemplary Logic Circuit Instances Having Memory Elements

Figure 5:
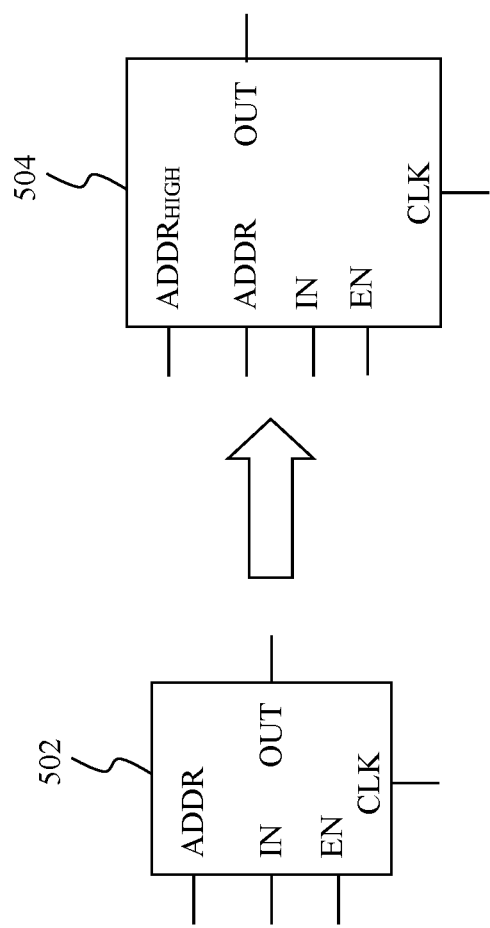
FIG. 5 graphically illustrates an exemplary replacement of one or more memory elements with functionally equivalent electronic circuitry according to exemplary embodiments of the present disclosure.

In some embodiments, one or more circuit instances, such as one or more of the circuit instances 204.1 through 204.$m$, the combinational logic circuit instances 304.1 through 304.$m$, and/or the sequential logic circuit instances 404.1 through 404.$m$, can include one or more memory elements, such as one or more as random-access memories (RAMs), and/or one or more read-only memories (ROMs) to provide some examples. The one or more RAMs can include one or more dynamic random-access memories (DRAMs), one or more static random-access memories (SRAMs), and/or one or more non-volatile random-access memories (NVRAMs), often referred to as flash memories, to provide some examples. The ROM can include one or more programmable read-only memories (PROMs), one or more one-time programmable ROMs (OTPs), one or more erasable programmable read-only memories (EPROMs), and/or one or more electrically erasable programmable read-only memories (EEPROMs) to provide some examples. FIG. 5 graphically illustrates an exemplary replacement of one or more memory elements with functionally equivalent electronic circuitry according to exemplary embodiments of the present disclosure. As illustrated in FIG. 5, the emulation host system can synthesize a partition, such as the PLE 206, the PLE 306, and/or the PLE 406 to provide some examples, to effectively replace a memory element 502 within the one or more circuit instances with a functionally equivalent memory element 504. As part of this replacement, the emulation host system effectively connects the input IN, the output OUT, the address ADDR, the enable EN, and the clocking signal CLK of the memory element 504 to the same electronic circuitry as the emulation host system effectively connects the input IN, the output OUT, the address ADDR, the enable EN, and the clocking signal CLK of the memory element 502. The emulation host system effectively connects the address $ADDR_{HIGH}$ of the memory element 504 to the one or more output lines of the counter 220 to allow the count on the one or more output lines of the counter 220 to be the highest-level address bits for the memory element 504.

Figure 6:
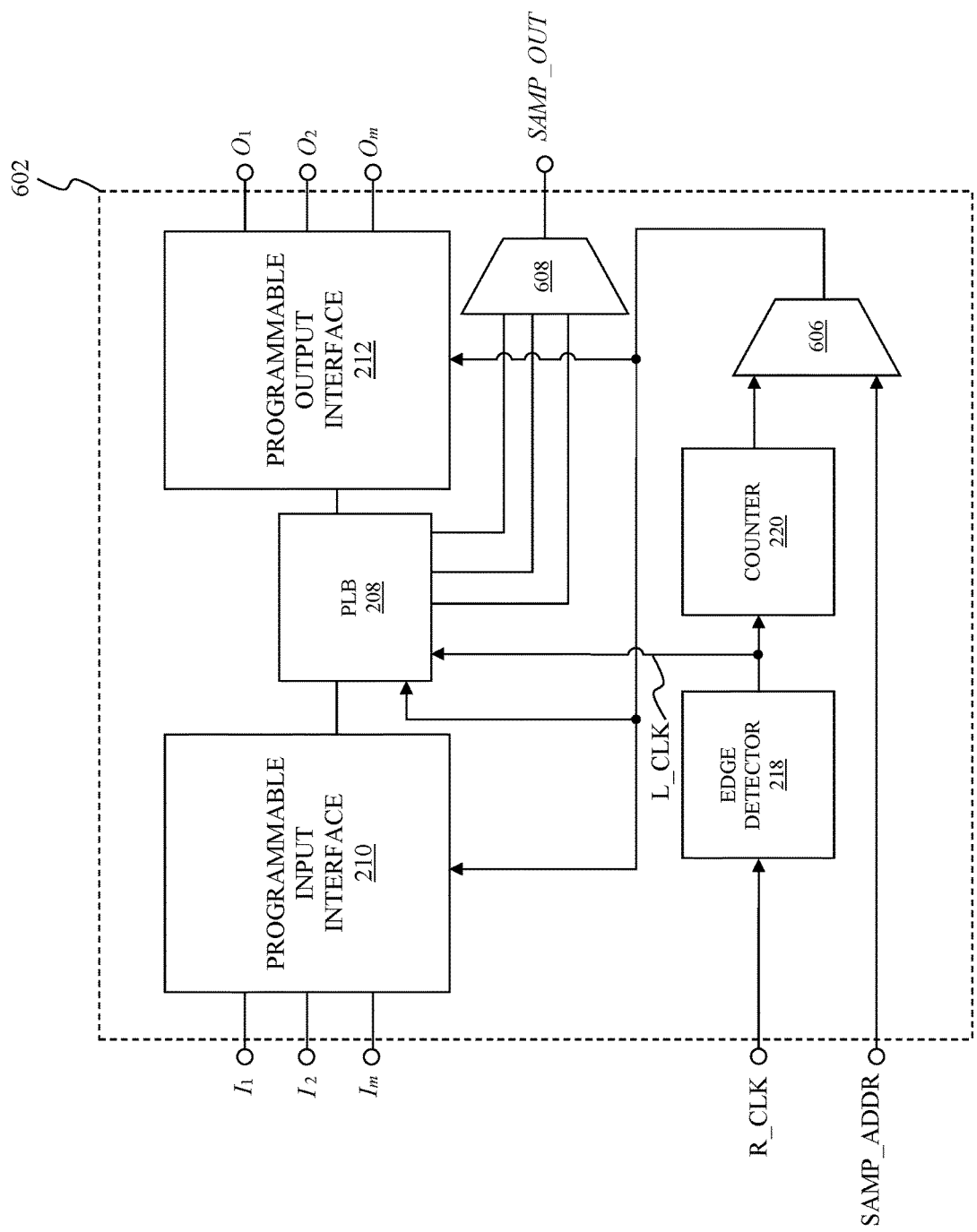
FIG. 6 graphically illustrates exemplary sampling instrumentation that can be added to exemplary logic circuit instances according to exemplary embodiments of the present disclosure.

Exemplary Sampling Instrumentation that can be Added to Exemplary Logic Circuit Instances FIG. 6 graphically illustrates exemplary sampling instrumentation that can be added to exemplary logic circuit instances according to exemplary embodiments of the present disclosure. In the exemplary embodiment illustrated in FIG. 6, an emulation host system, such as the emulation host system 104 as described above in FIG. 1, can analyze a hardware logic description of an electronic circuit design to identify multiple circuit instances of electronic circuitry within the electronic circuit design that are repetitive, namely, instantiated, and/or whose implementations can be mapped onto a single programmable logic element (PLE). The emulation host system can thereafter partition these multiple circuit instances of the electronic circuitry into one or more partitions and thereafter map these partitions onto the PLB 208 within a PLE 602. In the exemplary embodiment illustrated in FIG. 6, the emulation host system can synthesize the PLE 602 to include sampling instrumentation, such as trace logic to trace one or more states of one or more electronic components of the electronic circuit design and/or trace and injection logic to trace and/or to inject one or more electronic signals within a reprogrammable hardware emulation system, such as the reprogrammable hardware emulation system 102, to provide some examples. As illustrated in FIG. 6, the emulation host system can synthesize the PLE 602 to include an addressing multiplexer 606 and a sampling output multiplexer 608 to implement the sampling instrumentation. The PLE 602 as illustrated in FIG. 6 is substantially similar to the PLE 206 as illustrated in FIG. 2; therefore, only differences between the PLE 206 and the PLE 602 are to be described in further detail below.

In the exemplary embodiment illustrated in FIG. 6, the PLB 208 can include one or more memory elements, such as one or more of the RAMs and/or one or more of the ROMs as described above, to trace the one or more states of the one or more electronic components of the electronic circuit design and/or to trace the one or more electronic signals within the PLE 602. As illustrated in FIG. 6, the addressing multiplexer 606 can selectively choose a sampling address SAMP_ADDR and thereafter can provide the sampling address SAMP_ADDR to the one or more memory elements to selectively retrieve the one or more states of the one or more electronic components of the electronic circuit design and/or the one or more electronic signals within the PLE 602 from the one or more memory elements. The sampling output multiplexer 608 thereafter can selectively chose from among the one or more states of the one or more electronic components of the electronic circuit design and/or the one or more electronic signals within the PLE 602 from the one or more memory elements retrieved from the one or more memory elements using the sampling address SAMP_ADDR to provide a sampling output SAMP_OUT. In some embodiments, the emulation host system can utilize the sampling output SAMP_OUT to debug one or more the one or more electronic components of the electronic circuit as described above in FIG. 1.

Figure 7:
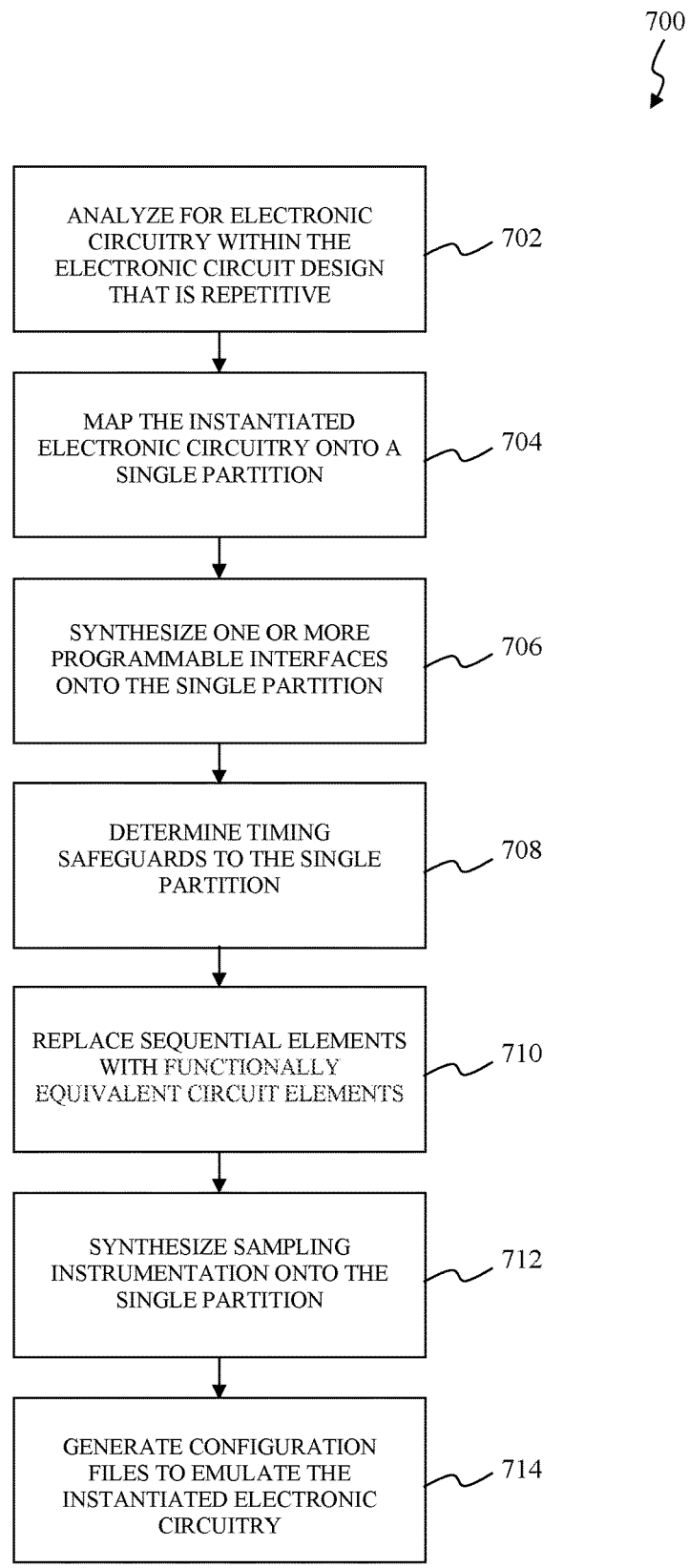
FIG. 7 illustrates a flowchart of an exemplary operational control flow for configuring an exemplary reprogrammable hardware emulation system according to exemplary embodiments of the present disclosure.

Exemplary Method of Configuring the Exemplary Reprogrammable Hardware Emulation System FIG. 7 illustrates a flowchart of an exemplary operational control flow for configuring an exemplary reprogrammable hardware emulation system according to exemplary embodiments of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow 700 for configuring a reprogrammable hardware emulation system, such as the reprogrammable hardware emulation system 102 as described above in FIG. 1, to emulate one or more circuit instances, such as the circuit instances 204.1 through 204.$m$, the combinational logic circuit instances 304.1 through 304.$m$, and/or the sequential logic circuit instances 404.1 through 404.$m$ as described above in FIG. 2 through FIG. 6 to provide some examples. In the exemplary embodiment illustrated in FIG. 7, an emulation host system, such as the emulation host system 104 as described above in FIG. 1, can perform the operational control flow 700.

At operation 702, the operational control flow 700 analyzes the electronic circuit design for electronic circuitry within the electronic circuit design that is repetitive, namely, instantiated, to identify one or more circuitry instances, such as the circuit instances 204.1 through 204.$m$, the combinational logic circuit instances 304.1 through 304.$m$, and/or the sequential logic circuit instances 404.1 through 404.$m$ as described above in FIG. 2 through FIG. 6. In some embodiments, the operational control flow 700 can further analyze the electronic circuit design for electronic circuitry within the electronic circuit design whose implementations can be mapped onto a single programmable logic element (PLE) of the reprogrammable hardware emulation system, such as the PLE 206, the PLE 306, the PLE 406, and/or the PLE 602 to provide some examples, when identifying the one or more circuitry instances.

At operation 704, the operational control flow 700 partitions the one or more circuitry instances from operation 702 into a single partition from among one or more partitions of the electronic circuit design and thereafter maps the single partition onto the single PLE. In some embodiments, the single PLE can represent an exemplary embodiment of one of the programmable logic units from among the one or more programmable logic units 106.1 through 106.$k$, one of the programmable logic blocks from among the one or more programmable logic blocks 108.1 through 108.$n$, one of the one or more programmable logic nodes from among the one or more programmable logic nodes 110.1 through 110.$a$, one of the programmable interconnect switches from among the one or more programmable interconnect switches 112.1 through 112.$b$ as described above in FIG. 1, and/or any combination thereof.

At operation 706, the operational control flow 700 synthesizes one or more programmable interfaces, such as the programmable input interface 210 and/or the programmable output interface 212 to provide some examples, onto the single partition to connect the single PLE to other programmable logic elements (PLEs) of the reprogrammable hardware emulation system, such as other programmable logic units from among the one or more programmable logic units 106.1 through 106.$k$, other programmable logic blocks from among the one or more programmable logic blocks 108.1 through 108.$n$, and/or other programmable logic nodes from among the one or more programmable logic nodes 110.1 through 110 as described above in FIG. 1

At operation 708, the operational control flow 700 can determine one or more timing safeguards to ensure the one or more circuitry instances from operation 702 can be emulated using the single PLE. In some embodiments, the operational control flow 700 can include the one or more timing safeguards within one or more configuration files that are to be described in further detail below. In some embodiments, the operational control flow 700 can encapsulate the single partition using one or more register barrier elements, such as one or more flip-flops, one or more shift registers, and/or one or more latches to provide some examples. The one or more register barrier elements effectively the re-time, one or more input emulation data sets, such as one or more the input emulation data sets $I_1$ through $I_m$, to be within a clocking domain of the single partition and/or one or more output emulation data sets, such as one or more of the output emulation data sets $O_1$ through $O_m$ to provide an example, to be within clocking domains of other partitions from among the one or more partitions of the electronic circuit design. The one or more register barrier elements ensure that the one or more input emulation data sets and/or the one or more output emulation data sets are sufficiently stable to allow for emulation of the electronic circuit design in its entirety. Moreover, in some embodiments, the operational control flow 700 can selectively schedule emulation of the one or more circuitry instances from operation 702. As an example, the operational control flow 700 can emulate a circuitry instance from the one or more circuitry instances from operation 702 whose input emulation data sets travel further distances within the reprogrammable hardware emulation system later in time as compared to circuitry instances whose input emulation data sets travel closer distances. As another example, the operational control flow 700 can emulate a circuitry instance from the one or more circuitry instances from operation 702 whose output emulation data sets travel further distances within the reprogrammable hardware emulation system earlier in time as compared to circuitry instances whose output emulation data sets travel closer distances.

At operation 710, the operational control flow 700 can synthesize the single partition to effectively replace one or more sequential elements, such as one or more flip-flops as described above in FIG. 4B and FIG. C, one or more latches as described above in FIG. 4D and FIG. E, one or more memory elements as described above in FIG. 6, within the one or more circuitry instances from operation 702 with functionally equivalent circuit elements. For example, the operational control flow 700 can synthesize the single partition to effectively replace the one or more flip-flops with one or more functionally equivalent memory elements and/or one or more shift registers as described above in FIG. 4B and FIG. C. As another example, the operational control flow 700 can synthesize the single partition to effectively replace the one or more latches with one or more functionally equivalent memory elements and/or one more multiplexers as described above in FIG. 4D and FIG. E.

At operation 712, the operational control flow 700 can synthesize sampling instrumentation onto the single partition. In some embodiments, the operational control flow 700 can synthesize the single partition to include trace logic to trace one or more states of one or more electronic components of the instantiated electronic circuitry and/or trace and injection logic to trace and/or to inject one or more electronic signals within the instantiated electronic circuitry as described above in FIG. 6. In these embodiments, the operational control flow 700 can synthesize the single partition to include one or more memory elements to store the one or more states and/or the one or more electronic signals and/or one or more multiplexers to address the one or more memory elements and/or to store the one or more states and/or the one or more electronic signals retrieved from the one or more memory elements.

At operation 714, the operational control flow 700 can generate the one or more configuration files that describe the single partition and the mapping of the single partition onto the single PLE. In these embodiments, the one or more configuration files can include additional information such as constraints of the electronic circuit design and routing information of connections between the programmable logic elements (PLEs) of the reprogrammable hardware emulation system. After generating one or more configuration files, the operational control flow 700 can provide the one or more configuration files to the reprogrammable hardware emulation system to configure the reprogrammable hardware emulation system to emulate the one or more circuitry instances from operation 702.

Exemplary Computer System for Implementing the Exemplary Emulation Host System

Figure 8:
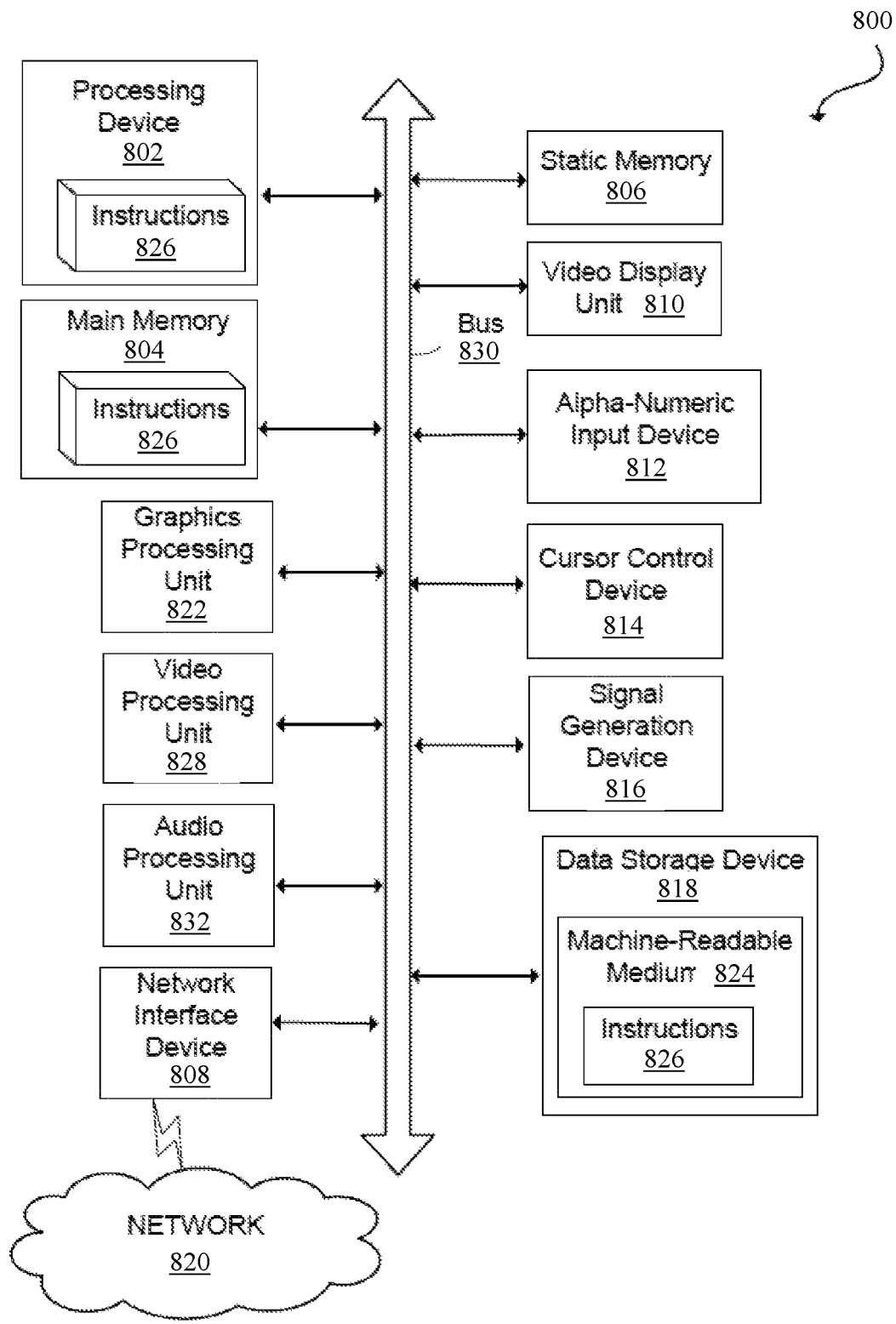
FIG. 8 illustrates a block diagram of an exemplary computer system for implementing the exemplary emulation host system according to exemplary embodiments of the present disclosure.

FIG. 8 illustrates a block diagram of an exemplary computer system for implementing the exemplary emulation host system according to exemplary embodiments of the present disclosure. In alternative implementations, the computer system may be connected (e.g., networked) to other computer systems in a LAN, an intranet, an extranet, and/or the Internet. The computer system may operate in the capacity of a server or a client computer system in client-server network environment, as a peer computer system in a peer-to-peer (or distributed) network environment, or as a server or a client computer system in a cloud computing infrastructure or environment.

The computer system may be a personal computer (PC), a tablet PC, a set-top box (STB), a Personal Digital Assistant (PDA), a cellular telephone, a web appliance, a server, a network router, a switch or bridge, or any computer system capable of executing a set of instructions (sequential or otherwise) that specify actions to be taken by that computer system. Further, while a single computer system is illustrated, the term "computer system" shall also be taken to include any collection of computer systems that individually or jointly execute a set (or multiple sets) of instructions to perform any one or more of the methodologies discussed herein.

In the exemplary embodiment illustrated in FIG. 8, the computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

The processing device 802 represents one or more processors such as a microprocessor, a central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a computer system-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting computer system-readable storage media.

In some implementations, the instructions 826 include instructions to implement functionality corresponding to the present disclosure. While the computer system-readable storage medium 824 is shown in an example implementation to be a single medium, the term "computer system-readable storage medium" should be taken to include a single medium or multiple media (e.g., a centralized or distributed database, and/or associated caches and servers) that store the one or more sets of instructions. The term "computer system-readable storage medium" shall also be taken to include any medium that is capable of storing or encoding a set of instructions for execution by the computer system and that cause the computer system and the processing device 802 to perform any one or more of the methodologies of the present disclosure. The term "computer system-readable storage medium" shall accordingly be taken to include, but not be limited to, solid-state memories, optical media, and magnetic media.

Exemplary Emulation of the Exemplary Logic Circuit Instances

Figure 9:
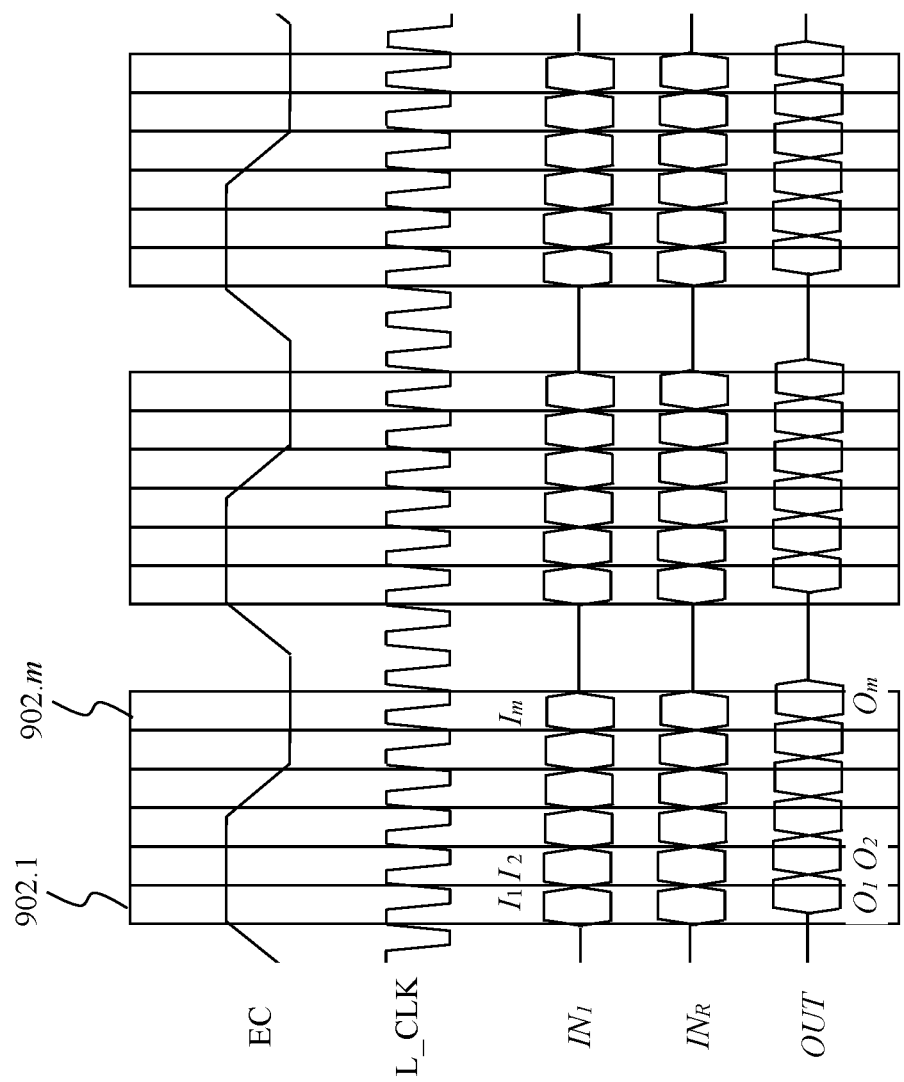
FIG. 9 graphically illustrates an exemplary emulation of the electronic circuit design according to exemplary embodiments of the present disclosure.

As described above, a reprogrammable hardware emulation system, such as the reprogrammable hardware emulation system 102 to provide an example, represents a configuration and arrangement of programmable electronic devices which can be connected to each other in accordance with the electronic circuit design to emulate the electronic circuit design. FIG. 9 graphically illustrates an exemplary emulation of the electronic circuit design according to exemplary embodiments of the present disclosure.

In the exemplary embodiment illustrated in FIG. 9, an emulation host system, such as the emulation host system 104 as described above in FIG. 1, can analyze an electronic circuit design to identify circuit instances 902.1 through 902.$m$ of electronic circuitry within the electronic circuit design that are repetitive, namely, instantiated, and/or whose implementations can be mapped onto a single programmable logic element (PLE), such as the PLE 206, the PLE 306, the PLE 406, and/or the PLE 602 as described above in FIG. 2 through FIG. 6. The circuit instances 902.1 through 902.$m$ as illustrated in FIG. 9, can represent exemplary embodiments of the circuit instances 204.1 through 204.$m$, the combinational logic circuit instances 304.1 through 304.$m$, and/or the sequential logic circuit instances 404.1 through 404.$m$ as described above in FIG. 2 through FIG. 6.

In the exemplary embodiment illustrated in FIG. 9, a reprogrammable hardware emulation system, such as the reprogrammable hardware emulation system 102 to provide an example, can emulate the electronic circuit design over one or more emulation cycles EC. In some embodiments, the emulation of the electronic circuit design represents a cycle, or cycle-based, emulation whereby the electronic circuit design, in its entirety, is emulated to in every emulation cycle from among one or more emulation cycles EC. As described above in FIG. 2 through FIG. 6, the reprogrammable hardware emulation system can emulate the circuit instances 902.1 through 902.$m$ utilizing the local clocking signal L_CLK. In some embodiments, as illustrated in FIG. 9, the local clocking signal L_CLK is configured to sequentially emulate the circuit instances 902.1 through 902.$m$ in every emulation cycle from among one or more emulation cycles EC.

As part of this sequential emulation, the reprogrammable hardware emulation system selectively chooses using, for example, the programmable input interface 210, an input emulation data set $IN_1$ through $IN_R$ from among the input emulation data sets $I_1$ through $I_m$ as described above in FIG. 2. Thereafter, the reprogrammable hardware emulation system applies the input emulation set $IN_1$ through $IN_R$ to the single programmable logic device to emulate a corresponding circuit instance from among the circuit instances 902.1 through 902.$m$ to provide an output emulation set. Next, the reprogrammable hardware emulation provides using, for example, the programmable output interface 212, the output emulation set to a corresponding output emulation data set from among the output emulation data sets $O_1$ through $O_m$ that corresponds to the corresponding circuit instance.

CONCLUSION

Some portions of the preceding detailed descriptions have been presented in relation to algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a computer system-readable medium having stored thereon instructions, which may be used to program a computer system (or other electronic devices) to perform a process according to the present disclosure. A computer system-readable medium includes any mechanism for storing information in a form readable by a computer system (e.g., a computer). For example, a computer system-readable (e.g., computer-readable) medium includes a computer system (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. An emulation host system for configuring a reprogrammable hardware emulation system to emulate an electronic circuit design, the emulation host system comprising:
    a memory that stores a plurality of instructions; and
    a processor configured to execute the plurality of instructions, the plurality of instructions, when executed by the processor, configuring the processor to:
        analyze the electronic circuit design for a plurality of electronic circuits that are repetitive,
        partition the plurality of electronic circuits onto a single partition,
        map the single partition onto a single programmable logic element (PLE) of the reprogrammable hardware emulation system, and
        configure the reprogrammable hardware emulation system to emulate the plurality of electronic circuits using the single PLE.

2. The emulation host system of claim 1, wherein the plurality of instructions, when executed by the processor, configures the processor to:
    analyze a hardware logic description of the electronic circuit design for the plurality of electronic circuits that are repetitive.

3. The emulation host system of claim 1, wherein the plurality of instructions, when executed by the processor, configures the processor to map the single partition onto a programmable logic block (PLB) within the single PLE.

4. The emulation host system of claim 3, wherein the PLB comprises:
    a programmable logic block from a Programmable Logic Array (PLA);
    a programmable logic block from a Programmable Array Logic (PAL) device;
    a programmable logic block from a Generic Logic Arrays (GLA);
    a programmable logic block from a Field Programmable Gate Array (FPGA); or
    a programmable logic block from a specialized application-specific integrated circuit (ASIC) for emulation or prototyping.

5. The emulation host system of claim 3, wherein the single PLE comprises:
    a programmable input interface configured to sequentially provide a plurality of input emulation data sets to the single PLB to emulate the plurality of electronic circuits; and
    a programmable output interface configured to sequentially provide an output emulation data set received from the single PLB after emulating each of the plurality of electronic circuits to corresponding output emulation data sets from among a plurality of output emulation data sets, and wherein the plurality of instructions, when executed by the processor, further configures the processor to synthesize the single partition to include the programmable input interface and the programmable output interface.

6. The emulation host system of claim 1, wherein the single PLE comprises:
   a single programmable logic unit from among a plurality of programmable logic units within the reprogrammable hardware emulation system;
   a single programmable logic block from among a plurality of programmable logic blocks within the reprogrammable hardware emulation system; or
   a single programmable logic node from among a plurality of programmable logic nodes within the reprogrammable hardware emulation system.

7. The emulation host system of claim 1, wherein the plurality of instructions, when executed by the processor, configures the processor to:
   generate one or more configuration files to configure the reprogrammable hardware emulation system to emulate the plurality of electronic circuits using the single PLE; and
   send the one or more configuration files to the reprogrammable hardware emulation system to configure the reprogrammable hardware emulation system to emulate the plurality of electronic circuits using the single PLE.

8. A method for configuring a reprogrammable hardware emulation system to emulate an electronic circuit design, the method comprising:
   analyzing, by a processor, the electronic circuit design for a plurality of electronic circuits that are repetitive;
   partitioning, by the processor, the plurality of electronic circuits onto a single partition;
   mapping, by the processor, the single partition onto a single programmable logic element (PLE) of the reprogrammable hardware emulation system; and
   configuring, by the processor, the reprogrammable hardware emulation system to emulate the plurality of electronic circuits using the single PLE.

9. The method of claim 8, wherein the analyzing comprises:
   analyzing a hardware logic description of the electronic circuit design for the plurality of electronic circuits that are repetitive.

10. The method of claim 8, wherein the mapping comprises:
    mapping the single partition onto a programmable logic block (PLB) within the single PLE.

11. The method of claim 10, wherein the mapping further comprises:
    mapping the single partition onto a programmable logic block from a Programmable Logic Array (PLA), a programmable logic block from a Programmable Array Logic (PAL) device, a programmable logic block from a Generic Logic Arrays (GLA), a programmable logic block from a Field Programmable Gate Array (FPGA), or a programmable logic block from a specialized application-specific integrated circuit (ASIC) for emulation or prototyping.

12. The method of claim 10, further comprising:
    synthesizing the single partition to include a programmable input interface configured to sequentially provide a plurality of input emulation data sets to the single PLB to emulate the plurality of electronic circuits and a programmable output interface configured to sequentially provide an output emulation data set received from the single PLB after emulating each of the plurality of electronic circuits to corresponding output emulation data sets from among a plurality of output emulation data sets.

13. The method of claim 8, wherein the mapping comprises:
    mapping the single partition onto a single programmable logic unit from among a plurality of programmable logic units within the reprogrammable hardware emulation system, a single programmable logic block from among a plurality of programmable logic blocks within the reprogrammable hardware emulation system, or a single programmable logic node from among a plurality of programmable logic nodes within the reprogrammable hardware emulation system.

14. The method of claim 8, wherein the configuring comprises:
    generating one or more configuration files to configure the reprogrammable hardware emulation system to emulate the plurality of electronic circuits using the single PLE; and
    sending the one or more configuration files to the reprogrammable hardware emulation system to configure the reprogrammable hardware emulation system to emulate the plurality of electronic circuits using the single PLE.

15. An emulation environment for emulating an electronic circuit design, the emulation environment comprising:
    a reprogrammable hardware emulation system having a plurality of programmable logic elements (PLE); and
    an emulation host system, communicatively coupled to the reprogrammable hardware emulation system, configured to:
        analyze the electronic circuit design for a plurality of electronic circuits that are repetitive,
        partition the plurality of electronic circuits onto a single partition,
        map the single partition onto a single PLE from among the plurality of PLEs of the reprogrammable hardware emulation system, and
        configure the reprogrammable hardware emulation system to emulate the plurality of electronic circuits using the single PLE.

16. The emulation environment of claim 15, wherein the emulation host system is configured to map the single partition onto a programmable logic block (PLB) within the single PLE.

17. The emulation environment of claim 16, wherein the PLB comprises:
    a programmable logic block from a Programmable Logic Array (PLA);
    a programmable logic block from a Programmable Array Logic (PAL) device;
    a programmable logic block from a Generic Logic Arrays (GLA);
    a programmable logic block from a Field Programmable Gate Array (FPGA); or
    a programmable logic block from a specialized application-specific integrated circuit (ASIC) for emulation or prototyping.

18. The emulation environment of claim 16, wherein the single PLE comprises:
    a programmable input interface configured to sequentially provide a plurality of input emulation data sets to the single PLB to emulate the plurality of electronic circuits; and a programmable output interface configured to sequentially provide an output emulation data set received from the single PLB after emulating each of the plurality of electronic circuits to corresponding output emulation data sets from among a plurality of output emulation data sets, and wherein the emulation host system is further configured to synthesize the single partition to include the programmable input interface and the programmable output interface.

19. The emulation environment of claim 15, wherein the single PLE comprises:

a single programmable logic unit from among a plurality of programmable logic units within the reprogrammable hardware emulation system;

a single programmable logic block from among a plurality of programmable logic blocks within the reprogrammable hardware emulation system; or a single programmable logic node from among a plurality of programmable logic nodes within the reprogrammable hardware emulation system.

20. The emulation environment of claim 15, wherein the emulation host system is further configured to:

generate one or more configuration files to configure the reprogrammable hardware emulation system to emulate the plurality of electronic circuits using the single PLE; and send the one or more configuration files to the reprogrammable hardware emulation system to configure the reprogrammable hardware emulation system to emulate the plurality of electronic circuits using the single PLE.

* * * * *